United States Patent
Engelhart et al.

(10) Patent No.: US 9,548,405 B2
(45) Date of Patent: Jan. 17, 2017

(54) SOLAR CELL

(75) Inventors: Peter Engelhart, Hameln (DE); Sven Wanka, Leipzig (DE); Wilhelmus Mathijs Marie Kessels, Tilburg (NL); Gijs Dingemans, Tilburg (NL)

(73) Assignee: Q-CELLS SE (DE)

( * ) Notice: Subject to any disclaimer, the term of this patent is extended or adjusted under 35 U.S.C. 154(b) by 0 days.

(21) Appl. No.: 13/140,282

(22) PCT Filed: Dec. 16, 2009

(86) PCT No.: PCT/EP2009/067340
§ 371 (c)(1),
(2), (4) Date: Sep. 7, 2011

(87) PCT Pub. No.: WO2010/070013
PCT Pub. Date: Jun. 24, 2010

(65) Prior Publication Data
US 2011/0308581 A1 Dec. 22, 2011

(30) Foreign Application Priority Data
Dec. 19, 2008 (DE) .................. 10 2008 055 036

(51) Int. Cl.
*H01L 31/02* (2006.01)
*H01L 31/0224* (2006.01)

(52) U.S. Cl.
CPC ........ *H01L 31/022425* (2013.01); *Y02E 10/50* (2013.01)

(58) Field of Classification Search
CPC ............................................. H01L 31/022425
See application file for complete search history.

(56) References Cited

U.S. PATENT DOCUMENTS

| 4,248,675 | A | | 2/1981 | Bozler et al. |
| 4,253,881 | A | | 3/1981 | Hezel |
| 5,009,719 | A | | 4/1991 | Yoshida |
| 5,356,488 | A | * | 10/1994 | Hezel ............................ 136/256 |
| 5,563,092 | A | * | 10/1996 | Ohmi ................ H01L 21/02381 |
| | | | | 118/723 E |
| 6,692,986 | B1 | | 2/2004 | Bayer et al. |
| 7,078,613 | B2 | * | 7/2006 | Spivack et al. ............... 136/256 |
| 8,686,283 | B2 | * | 4/2014 | Heng .................. H01L 31/0745 |
| | | | | 136/255 |
| 2006/0102972 | A1 | * | 5/2006 | Bhattacharyya ............... 257/432 |
| 2006/0255340 | A1 | | 11/2006 | Manivannan et al. |

(Continued)

FOREIGN PATENT DOCUMENTS

DE 2846096 A1 4/1980
DE 102008045522 A1 3/2010

(Continued)

OTHER PUBLICATIONS

Mullet et al, Surface electrochemical properties of mixed oxide ceramic membranes: Zeta-potential and surface charge density, Journal of Membrane Science, 1997, Elsevier, vol. 123, pp. 255-265.*

(Continued)

*Primary Examiner* — Monique Jackson
(74) *Attorney, Agent, or Firm* — Heslin Rothenberg Farley & Mesiti, P.C.; Victor A. Cardona, Esq.

(57) ABSTRACT

A solar cell includes a semiconductor layer, a collecting layer for collecting free charge carriers from the semiconductor layer and a buffer layer which is arranged between the semiconductor layer and the collecting layer. The buffer layer is designed as a tunnel contact between the semiconductor layer and the collecting layer. The buffer layer essentially includes a material with a surface charge density of at least $10^{12}$ cm$^{-2}$, preferably of at least $5\times10^{12}$ cm$^{-2}$, and more preferably of at least $10^{13}$ cm$^{-2}$.

15 Claims, 4 Drawing Sheets

(56) References Cited

U.S. PATENT DOCUMENTS

Figure 1:
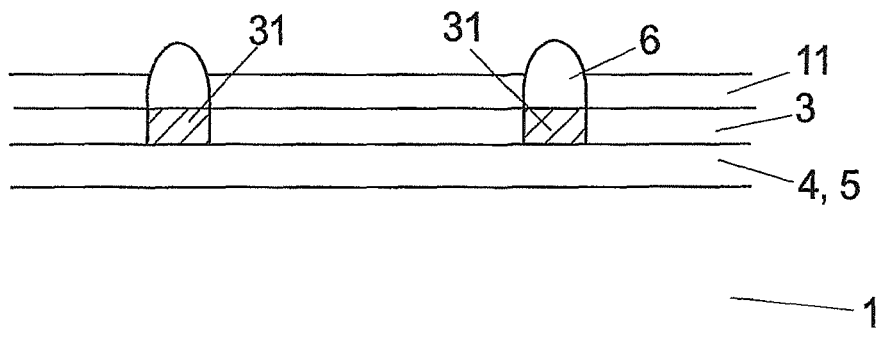

| | | | |
|---|---|---|---|
| 2007/0256728 A1* | 11/2007 | Cousins | H01L 31/0745 136/252 |
| 2008/0072959 A1* | 3/2008 | Chen et al. | 136/257 |
| 2008/0105299 A1 | 5/2008 | Krasnov | |
| 2011/0297227 A1 | 12/2011 | Pysch et al. | |

FOREIGN PATENT DOCUMENTS

| | | |
|---|---|---|
| EP | 1460693 A2 | 9/2004 |
| WO | WO 01/20676 A1 | 3/2001 |

OTHER PUBLICATIONS

Schmidt et al, Surface Passivation of High-efficienty Silicon Solar Cells by Atomic-layer-deposited Al2O3, Progress in Photovoltaics: Research and Applications, 2008, vol. 16, pp. 461-466.*

Hoex et al, Ultralow surface recombination of c-Si substrates passivated by plasma-assisted atomic layer deposited Al2O3, Applied Physics Letters 89, 2006, pp. 042112-1-042112-3.*

Hoex et al, On the c-Si surface passivation mechanism by the negative-charge-dielectric Al2O3, Journal of Applied Physics 104, 2008, 113703-1 to 113703-7.*

Gusev et al, High-resolution depth profiling in ultrathin Al2O3 films on Si, Applied Physics Letters, vol. 76, No. 2, 2000, pp. 176-178.*

Hoex et al, Excellent passivation of highly doped p-type Si surfaces by the negative-charge-dielectric Al2O3, Applied Physics Letters 91, 2007, pp. 112107-1 to 112107-3.*

Agostinelli et al, Very low surface recombination velocities on p-type silicon wafers passivated with a dielectric with fixed negative charge, Solar Energy Materials & Solar Cells, vol. 90, 2006, pp. 3438-3443.*

Konig et al., "P Inversion Layer SI Solar Cells as Test for the I-S structure" Results and Prospects, 3rd World Conference on Photovoltaic Energy Conversion, May 18, 2003, pp. 232-2355, XP002572842, Osaka, Japan.

International Search Report and Written Opinion for corresponding International Application No. PCT/EP2009/067340, completed on Feb. 15, 2010, and mailed on Mar. 2, 2010.

\* cited by examiner

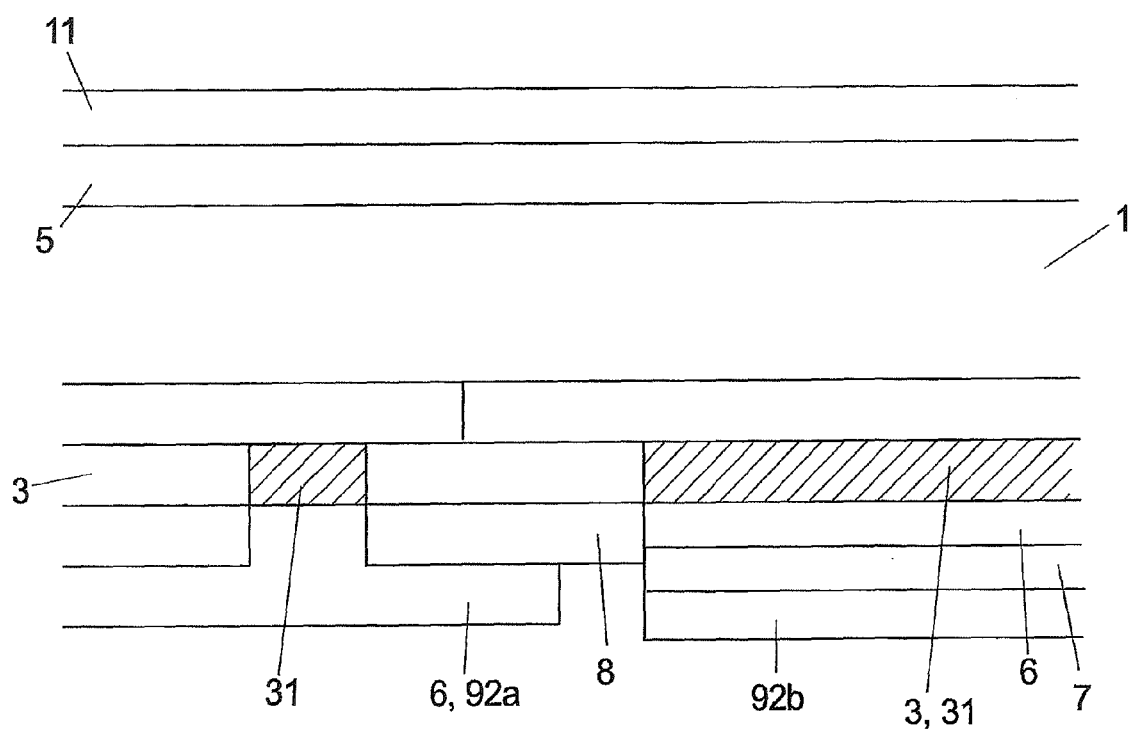

SOLAR CELL

CROSS REFERENCE TO RELATED APPLICATIONS

This application is a national stage of PCT International Application No. PCT/EP2009/067340, filed on Dec. 16, 2009, and published in English on Jun. 24, 2010, as WO 2010/070013 A1, and claims priority to German Application No. 102008055036.1-33 filed on Dec. 19, 2008, the entire disclosures of which are incorporated herein by reference.

The invention relates to a solar cell with a tunnel contact.

The use of a tunnel layer system for contacting a solar cell is known. In this arrangement a tunnel layer is inserted between the emitter or base of the solar cell semiconductor and a metal layer that acts as a collecting layer for the charge carriers that tunnel through the tunnel layer. For example silicon oxide ($SiO_2$) is used as such a tunnel layer. It can at the same time be used to carry out surface passivation in that recombination-active surface states of the semiconductor are saturated. In solar cells that are formed based on a silicon the tunnel layer can be produced by means of thermal oxidation. However, an $SiO_2$ layer is associated with a disadvantage in that adequate surface passivation with at the same time high tunnelling probability of the charge carriers in the metal layer is difficult to implement from the point of view of technology.

Furthermore, as a rule, in solar cells with a heterojunction, which comprises, for example, a crystalline layer and an amorphous layer, which as a rule is mostly doped, of a semiconductor, an additional layer is inserted between the two semiconductor layers in order to achieve surface passivation, in particular of the crystalline semiconductor layer. To this effect, as a rule, a thin, intrinsic, i.e. essentially doping-free, amorphous semiconductor layer is used. In this arrangement too, passivation, for example by means of an intrinsic amorphous silicon layer, is often insufficient, which results in a reduction in the efficiency of the solar cell. Furthermore, homogeneous layer deposition, for example by means of vapour-deposition from the gas phase, is technologically difficult to implement if at the same time a high tunnelling probability is to be achieved.

It is thus the object of the invention to provide a solar cell comprising a tunnel layer that is arranged between a semiconductor layer and a collecting layer, which solar cell is technologically easy to implement and moreover provides good efficiency.

The invention is based on the recognition that a buffer layer with a high surface charge density of at least $10^{12}$ $cm^{-2}$, preferably of at least $5 \times 10^{12}$ $cm^{-2}$, more preferably of at least $10^{13}$ $cm^{-2}$, is particularly well suited to form a tunnel contact and at the same time to ensure adequate surface passivation by means of field effect passivation. Moreover, the buffer layer, due to its high surface charge density, can induce an inversion layer or accumulation layer in a semiconductor layer situated underneath it. The surface charge density of the buffer layer can be either negative or positive. The intensity and type of the induced layer depends in particular on the polarity of the surface charge density, as well as on the material and any doping of the semiconductor layer. The electrical properties and the spatial expansion of the tunnel contact also depend on the electrical characteristics of the inversion layer or accumulation layer.

In this document the term "layer" can also refer to a layer-shaped structure that extends only over a limited region on the solar cell. In other words the semiconductor layer, collecting layer, buffer layer or the like can be limited to insular or strip-shaped regions on the solar cell. It is thus not necessary for the layers to essentially extend over the entire solar cell, which is usually planar. Furthermore, the term "layer" need not necessarily relate to a planar or flat position; instead, conforming to an underlying structure, it may be curved or bent, for example it may be dish-shaped or cup-shaped in design.

A possible method for producing the solar cell comprises a step of providing the semiconductor layer, subsequent application of the buffer layer onto the semiconductor layer, and furthermore the application of the collecting layer onto the buffer layer. Additional application steps for applying intermediate layers or structuring steps may be provided. The semiconductor layer can be present in the form of a wafer, or can be vapour-deposited onto a substrate in a thin-film process. In the latter case the sequence of layer depositing can also be reversed so that, for example, at first a collecting layer is applied to a substrate or a superstrate, and subsequently the buffer layer and the semiconductor layer are vapour-deposited onto said collecting layer.

That the buffer layer is essentially made of a certain material means in particular that the buffer layer may comprise traces of other materials due to imperfections in the fabrication process, in the raw materials or the like.

According to an advantageous embodiment, the buffer layer is essentially made of a material with a negative surface charge density. Aluminium fluoride ($AlF_3$) with a negative charge density of between approximately $10^{12}$ and approximately $10^{13}$ $cm^{-2}$ is one example of a material with negative surface charge density. Negative surface charge density provides an advantage in that the material is particularly suitable for contacting a p-type semiconductor layer, which, for example, in silicon-based photovoltaics is by far the most frequently-used conductive type for an absorber.

An expedient improvement provides for the buffer layer to essentially be made of aluminium oxide. With the use of a suitable application process or vapour-depositing process, aluminium oxide ($Al_2O_3$) can be applied in a homogeneous layer thickness. Furthermore, such an aluminium oxide layer is particularly well suited for surface passivation. As a result of its high negative surface charge density, an inversion layer or accumulation layer induced in this manner further comprises good conductivity.

A preferred embodiment provides for the buffer layer to be formed without pinholes. In other words the buffer layer is essentially free of faults, and in particular does not contain any openings (pinholes) that extend through the thickness of the buffer layer.

According to an advantageous embodiment, the buffer layer has been applied by means of atomic layer deposition (ALD). By means of ALD, in which layer deposition of one atomic layer after another takes place, in particular thin layers can be produced without any defects. In this process the layer thickness can be controlled very precisely. In particular in the production of aluminium oxide layers, ALD results in buffer layers with very advantageous electronic characteristics.

Preferably, the buffer layer comprises a thickness ranging between 0.1 and 10 nanometers, preferably ranging between 1 and 3 nanometers. In particular in a thickness of between 1 and 3 nm, due to a sufficient number of bound charges, good passivation will result, at the same time with high tunnelling probability.

An advantageous improvement provides for the semiconductor layer to be made of a crystalline semiconductor. This can, for example, be a semiconductor wafer that serves as the starting point in the production of the solar cell.

An expedient embodiment provides for the semiconductor layer to be an n-type or p-type semiconductor layer. The semiconductor layer thus comprises base doping. Due to the buffer layer, furthermore an inversion layer or an accumulation layer underneath the buffer layer can be induced, wherein, for example, a buffer layer, depending on the signs of its surface charge density, in an n-type semiconductor layer induces an $n^+$-type accumulation layer or a p-type inversion layer. Doping of the semiconductor layer can take place during its manufacture or subsequently by means of a diffusion step.

In this context it should be pointed out that the terms "n-type" or "p-type" denote that the semiconductor layer has been doped with a doping material in such a way that it forms an n-type or a p-type semiconductor. In the present document these terms are used synonymously with the terms "n-doped" and "p-doped".

According to a preferred embodiment, the semiconductor layer adjoining the buffer layer comprises a doping layer and/or an inversion layer or accumulation layer induced by means of the buffer layer. Both the doping layer and the inversion layer are suitable for generating band bending such that in the semiconductor, separation of charge carriers takes place, which charge carriers were generated by means of light incidence. In this arrangement, for example, the semiconductor layer can comprise base doping so that this layer together with the inversion layer induced therein forms a pn-junction.

As an alternative, such a pn-junction can already have been formed between the base-doped semiconductor layer and the doping layer. In this case the induced accumulation layer can be used to control the electronic characteristics of the tunnel contact, formed by means of the buffer layer, between the semiconductor layer and the collecting layer.

Expediently it is provided for the buffer layer to be designed as an anti-reflection layer (AR layer). An anti-reflection layer is used to reduce or entirely prevent back reflection of incident light impinging on the solar cell. Consequently the efficiency of the solar cell is increased. The AR layer should preferably be effective for the wavelength range for which the solar cell is tailored, for example in that it is most sensitive in this range. This characteristic can be set by means of suitable selection of the material and of the layer thickness of the buffer layer.

A preferred improvement provides for the collecting layer to comprise a metal, a metal alloy and/or a transparent conductive material. Furthermore, the collecting layer can be structured, for example in order to form electrode fingers by means of which the current generated in the solar cell can be tapped. The transparent conductive material is a material that is transparent to the wavelength spectrum for which the solar cell is designed, for example to the visible and/or infrared spectrum. Preferably the material is a transparent conductive oxide (TCO) such as indium tin oxide (ITO), zinc oxide or the like.

An advantageous embodiment provides for the collecting layer to comprise a semiconductor. In this case, over the collecting layer preferably a contact layer that is also structured is applied in order to accommodate the charge carriers that have tunnelled into the collecting layer. Advantageously it is provided for the collecting layer to be n-doped or p-doped. A layer comprising highly-doped polycrystalline silicon is one example of a collecting layer comprising semiconductors.

An expedient embodiment provides for the collecting layer to comprise an amorphous semiconductor. For example this can be a heterojunction layer which comprises an amorphous or a microcrystalline semiconductor material, while the semiconductor layer that is arranged underneath the buffer layer is crystalline. Usually, for passivation purposes an intrinsic amorphous semiconductor layer is inserted between these semiconductor layers with different crystal structures. A layer arrangement comprising crystalline silicon (c-Si) and amorphous or microcrystalline silicon (a-Si or µc-Si) is one example of a heterojunction.

In the present embodiment the intrinsic amorphous semiconductor layer is replaced by the buffer layer so that a tunnel contact forms between the semiconductor layer and the heterojunction layer. Replacing the intrinsic amorphous semiconductor layer is associated with an advantage in that it is not necessary, as is normally the case, to find a compromise between $V_{OC}$-gain (with $V_{OC}$ denoting the open circuit voltage) and fill factor losses (FF-losses) by means of setting the layer thickness of the intrinsic layer.

An expedient improvement provides for a contact layer made of a conductive material to be formed on the collecting layer. In this arrangement the contact layer can comprise a metal, a metal alloy and/or a transparent conductive material. Furthermore, the contact layer, which can be a front or a back contact, can be structured, for example in order to form finger-shaped contacts if applicable with busbars.

A preferred embodiment provides for a further buffer layer to be provided between the semiconductor layer and a further collecting layer, namely on a face of the semiconductor layer, which face points away from the buffer layer.

Independently of the buffer layer and the collecting layer, the further buffer layer and the further collecting layer can comprise the embodiments described above and below in the context of said collecting layer. For example, the collecting layer can comprise a metal layer, while the further collecting layer forms a heterojunction with the semiconductor layer.

Figure 2:
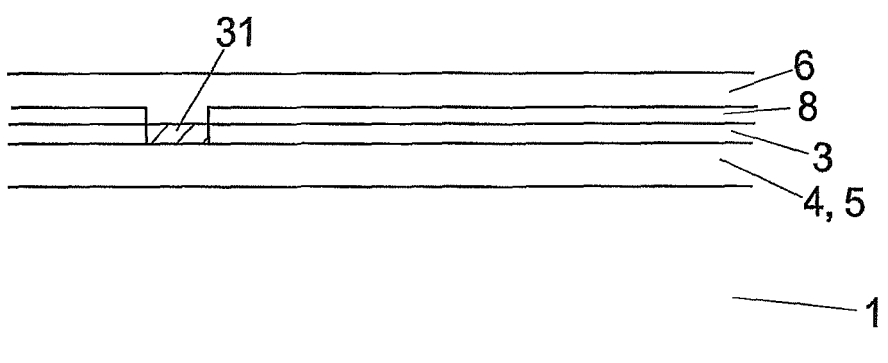
Figure 3:
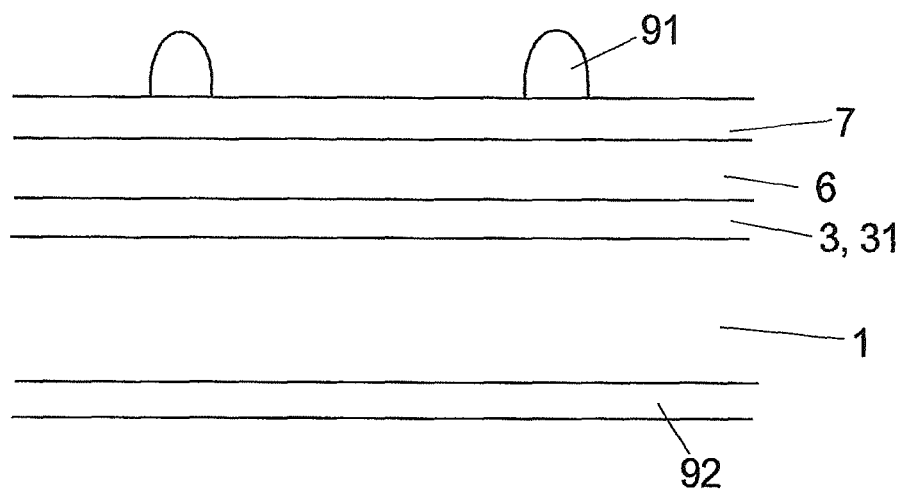
Figure 4:
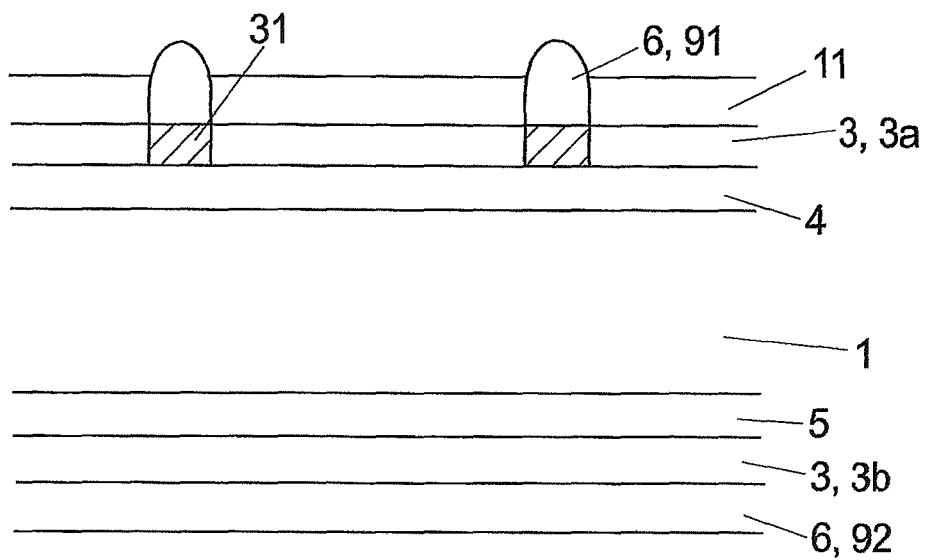
Figure 5:
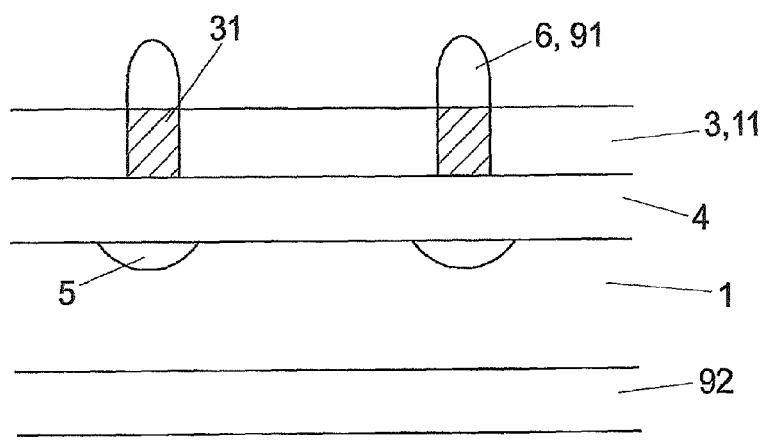
Figure 6:
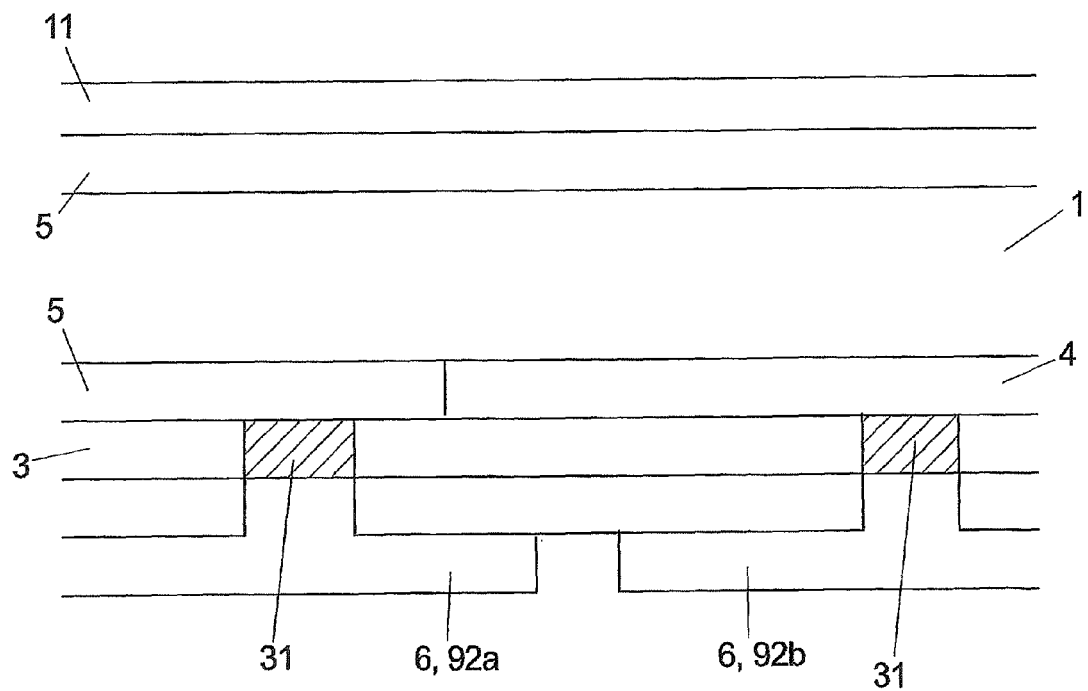

Below, the invention is explained with reference to the figures by means of exemplary embodiments. The following are shown in diagrammatic cross-sectional drawings:

FIG. 1 an embodiment of a solar cell comprising a buffer layer and a collecting layer designed as finger electrodes;

FIG. 2 a further embodiment of the solar cell comprising a buffer layer and a continuous collecting layer;

FIG. 3 a solar cell comprising a heterojunction, in which the buffer layer is incorporated;

FIG. 4 a solar cell comprising buffer layers arranged on both faces of the semiconductor layer;

FIG. 5 a further solar cell comprising a doping layer underneath the buffer layer;

FIG. 6 an embodiment of a back-contacted solar cell; and

FIG. 7 a further embodiment of a back-contacted solar cell.

FIG. 1 shows a solar cell comprising a semiconductor layer 1, a buffer layer 3 arranged thereon, and a collecting layer 6 vapour-deposited on the buffer layer 3. The collecting layer 6 is structured to form finger-shaped metal electrodes and is used to collect charge carriers that have been generated in the semiconductor layer by means of incident light. To this effect the electrically insulating buffer layer 3 forms tunnel contacts 31 between the semiconductor layer 1 and the collecting layer 6, through which the charge carriers tunnel into the collecting layer 6.

The buffer layer 3 is preferably an aluminium oxide layer that has been applied to the semiconductor layer 1 by means of atomic layer deposition (ALD). Thus a layer thickness is obtained which essentially stays the same over the entire buffer layer 3, with the atomic scale of said layer thickness in addition being precisely settable. In this manner the electronic characteristics of the tunnel contacts 31 can be precisely set. The tunnel contacts 31 are thus tunnel regions 31 in the buffer layer 3.

Directly underneath the buffer layer 3 a doping layer 5 is formed in the semiconductor layer 1 by means of diffusion. As an alternative, the doping layer 5 can have been applied to the semiconductor layer 1 by means of a vapour-deposition process. Due to the surface charge density of the buffer layer 3, instead of the doping layer 5 directly underneath the buffer layer 3 an inversion layer or accumulation layer 4 can be induced. For example, if the semiconductor layer 1 is n-doped, for example in the form of a base-doped semiconductor wafer, by means of a subsequent overcompensating diffusion process a p-doped doping layer 5 can be produced in order to obtain a pn-junction. As an alternative, the use of a suitable material, for example of aluminium oxide, for the buffer layer 3 can result in the buffer layer 3 inducing a p-doped inversion layer 4 in the semiconductor layer 1, thereby producing the pn-junction.

Furthermore, it is possible for the buffer layer 3 to produce in the semiconductor layer 1 an accumulation layer 4 that adjoins it. This is the case, for example, if the semiconductor layer 1 is p-doped and the buffer layer 3 comprises aluminium oxide, as a result of which a $p^+$-doped accumulation layer 4 is produced.

Above the buffer layer 3 an anti-reflection layer 11 is arranged, which with the selection of a suitable refractive index and a suitable layer thickness is designed to minimise or avoid reflection of the incident light at least over a defined spectral region and angle of incidence region. The finger-shaped electrodes that form the collecting layer 6 are partly surrounded by the anti-reflection layer 11. Instead of the additional anti-reflection layer 11, with suitable selection of the material and of the layer thickness, the buffer layer 3 can be used as an anti-reflection layer.

FIG. 2 shows a solar cell according to a further embodiment in which the collecting layer 6 comprises a continuous layer, which without structure extends over a surface of a solar cell, which layer comprises a conductive material, for example metal. To ensure that the tunnel contact 31 between the inversion layer or accumulation layer 4 or doping layer 5 in the semiconductor layer 1 through the buffer layer 3 only forms locally rather than along the entire buffer layer 3, between the buffer layer 3 and the collecting layer 6 an insulation layer 8 is arranged which comprises an opening above the tunnel contact 31.

FIGS. 1 and 2 only show front contacting of the solar cell. In order to provide a better overview the back surface contacts have been left out in these figures. For example, it is possible for the collecting layers 3 shown in FIGS. 1 and 2 in each case to form a front collecting layer 3 and a back collecting layer 3 of one and the same solar cell.

FIG. 3 shows a solar cell that is contacted on both sides, which solar cell comprises a heterojunction. The heterojunction forms between the semiconductor layer 1 and the collecting layer 6 between which the buffer layer 3 is arranged. For example, the collecting layer 6 can comprise amorphous silicon, while the semiconductor layer 1 is formed from crystalline silicon. Essentially the entire buffer layer 3 acts as a tunnel layer 31. When compared to a conventional heterojunction with a crystalline semiconductor layer, an amorphous semiconductor layer and an intrinsic amorphous semiconductor layer arranged in between, in the present embodiment an alternative heterojunction is thus created.

With the use of ALD the layer thickness of a buffer layer 3 that, for example, comprises aluminium oxide can be precisely controlled. Buffer layers 3 that have been vapour-deposited in this way and that comprise a sufficiently high surface charge density furthermore result in very good surface passivation. Furthermore, here too, as already explained with reference to FIGS. 1 and 2, an inversion layer or accumulation layer 4 (not shown) can form underneath the buffer layer 3 in the semiconductor layer 1.

On the collecting layer 6 a contact layer 7 is arranged which comprises, for example, a conductive transparent material. Finally, the solar cell comprises a front-surface electrode 91 and a back-surface electrode 92. While the front-surface electrode 91 is structured to form electrode fingers so that incident light can reach the solar cell through the contact layer 7 with only little shading, the back-surface electrode 92 is planar in shape. Above the back-surface electrode 92 the semiconductor layer 1 can additionally comprise a doping layer in order to improve ohmic contact between the semiconductor layer 1 and the back-surface electrode 92.

FIG. 4 shows a further solar cell that is contacted on both faces. On both faces of the semiconductor layer 1 this solar cell comprises a buffer layer 3. A front-surface buffer layer 3a is followed by an inversion layer or accumulation layer 4 that is induced in the semiconductor layer 1 as a result of the former, while a back-surface buffer layer 3b is formed on a doping layer 5. The collecting layers 6 associated with the buffer layers 3a, 3b are a structured front-surface electrode 91 and a back-surface electrode 92 that extends over the entire surface. Correspondingly, tunnel regions 31 that are delimited in area form in the front-surface buffer layer 3a, while the back-surface buffer layer 3b essentially acts completely as a tunnel contact 31.

In a manner similar to that in the embodiment according to FIG. 1, here, too, an anti-reflection layer 11 is formed on the front-surface buffer layer 3a. In the front embodiment the inversion layer or accumulation layer 4 and the doping layer 5 can be exchanged, or the semiconductor layer 1 can on both sides comprise an inversion layer or accumulation layer 4 and/or a doping layer 5.

FIG. 5 shows a solar cell in which the semiconductor layer 1 on one face comprises both an inversion layer or accumulation layer 4 and a doping layer 5. For the formation of the doping layer 5 the semiconductor layer 1 is, however, only doped in those sections that are located underneath the finger-shaped front-surface electrode 91 and thus underneath the tunnel regions 31 that form between the collecting layer 6 and the semiconductor layer 1. While in the present embodiment the inversion layer or accumulation layer 4 is responsible for band bending and thus for charge carrier separation, with a suitable selection of their doping parameters such as, for example, doping type, doping intensity, doping depth and the like, the doping layer 5 serves partly or exclusively to improve the tunnel contact 31.

FIG. 6 shows a back-contacted solar cell that comprises a semiconductor layer 1 and on the back face comprises a buffer layer 3. The buffer layer 3 comprises an insulation layer 8 from a suitable electrically insulating material, on which insulation layer 8 a collecting layer 6 is arranged. The collecting layer 6 is divided into a back-surface base electrode 92a, and an back-surface emitter electrode 92b. The back-surface base electrode 92a is connected to a doping layer 5 by way of a tunnel contact 31 formed in the buffer layer 3. By way of a further tunnel contact 31 the back-surface emitter electrode 92b is connected to an inversion layer or accumulation layer 4 that is induced in the semiconductor layer 1 due to the surface charge of the buffer layer 3. The inversion layer or accumulation layer 4 thus forms the emitter in the solar cell. In this embodiment, too, the inversion layer or accumulation layer 4 and the doping layer 5 can overlap.

Above the semiconductor layer 1 and thus on a face of light incidence of the solar cell there is a further doping layer 5, which is covered by an anti-reflection layer 11. Here, too, the doping layer 5 can have been replaced by an inversion layer or accumulation layer 4 which is induced by means of a buffer layer 3 arranged underneath the anti-reflection layer 11 (which buffer layer 3 in the present embodiment, however, only serves as an inversion layer).

FIG. 7 shows a further embodiment of a back-contacted solar cell. It differs from the solar cell shown in FIG. 6 in that the back-surface emitter electrode 92b is connected to the semiconductor layer 1 by way of a heterojunction similar to the one shown in FIG. 3. In this embodiment, too, the buffer layer 3 underneath the collecting layer 6 forms a tunnel contact 31 that expands in a planar manner.

LIST OF REFERENCE CHARACTERS

1 Semiconductor layer
3 Buffer layer
3a Front-surface buffer layer
3b Back-surface buffer layer
31 Tunnel contact (tunnel region)
4 Inversion layer (accumulation layer)
5 Doping layer
6 Collecting layer
7 Contact layer
8 Insulation layer
91 Front-surface electrode
92 Back-surface electrode
92a Back-surface base electrode
92b Back-surface emitter electrode
Anti-reflection layer

The invention claimed is:

1. A solar cell comprising:
a semiconductor layer in the form of a wafer or a layer vapor-deposited onto a substrate in a thin-film process, a collecting layer for collecting free charge carriers from the semiconductor layer and a buffer layer which is arranged between the semiconductor layer and the collecting layer, said buffer layer forming a tunnel contact between the semiconductor layer and the collecting layer, and the buffer layer essentially made of a material with a negative surface charge density of at least $10^{12}$ cm$^{-2}$;
the buffer layer comprising a thickness ranging between 1 and 3 nm;
wherein the semiconductor layer adjacent to the buffer layer comprises a doping layer and/or an inversion layer or accumulation layer induced by means of the buffer layer, whereby the doping layer and/or inversion layer or accumulation layer is adjacent to the buffer layer; and
wherein the semiconductor layer is p-doped or the collecting layer comprises a semiconductor.

2. The solar cell according to claim 1, wherein the buffer layer consists essentially of aluminium oxide.

3. The solar cell according to claim 1, wherein the buffer layer is formed without pinholes.

4. The solar cell according to claim 1, wherein the buffer layer has been applied by means of atomic layer deposition.

5. The solar cell according to claim 1, wherein the semiconductor layer is made of a crystalline semiconductor.

6. The solar cell according to claim 1, wherein the semiconductor layer is n-doped or p-doped.

7. The solar cell according to claim 1, wherein the buffer layer is designed as an anti-reflection layer.

8. The solar cell according to claim 1, wherein the collecting layer comprises a metal, a metal alloy and/or a transparent conductive material.

9. The solar cell according to claim 1, wherein the collecting layer comprises a semiconductor.

10. The solar cell according to claim 9, wherein the collecting layer comprises an amorphous semiconductor.

11. The solar cell according to claim 10, wherein the collecting layer is n-doped or p-doped.

12. The solar cell according to claim 11, wherein the collecting layer comprises a contact layer of a conductive material.

13. The solar cell according to claim 1, wherein on a face of the semiconductor layer, which face points away from the buffer layer, a further buffer layer is provided between the semiconductor layer and a further collecting layer.

14. The solar cell of claim 1 wherein the buffer layer is essentially made of a material with a surface charge density of at least $5\times10^{12}$ cm$^{-2}$.

15. The solar cell of claim 1 wherein the buffer layer is essentially made of a material with a surface charge density of at least $10^{13}$ cm$^{-2}$.

* * * * *

UNITED STATES PATENT AND TRADEMARK OFFICE
CERTIFICATE OF CORRECTION

| | | |
|---|---|---|
| PATENT NO. | : 9,548,405 B2 | Page 1 of 1 |
| APPLICATION NO. | : 13/140282 | |
| DATED | : January 17, 2017 | |
| INVENTOR(S) | : Engelhart et al. | |

It is certified that error appears in the above-identified patent and that said Letters Patent is hereby corrected as shown below:

In the Claims

Column 8, Line 32: Claim 11, Delete "claim 10" and insert -- claim 9 --

Column 8, Line 34: Claim 12, Delete "claim 10" and insert -- claim 9 --

Signed and Sealed this
Fourteenth Day of March, 2017

Michelle K. Lee
*Director of the United States Patent and Trademark Office*